(12) United States Patent
Kang et al.

(10) Patent No.: US 12,402,501 B2
(45) Date of Patent: Aug. 26, 2025

(54) DISPLAY DEVICE

(71) Applicant: Samsung Display Co., LTD., Yongin-si (KR)

(72) Inventors: Ki Nyeng Kang, Sejong-si (KR); Guang Hai Jin, Suwon-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 386 days.

(21) Appl. No.: 17/966,653

(22) Filed: Oct. 14, 2022

(65) Prior Publication Data

US 2023/0189598 A1  Jun. 15, 2023

(30) Foreign Application Priority Data

Dec. 14, 2021 (KR) .................. 10-2021-0179016

(51) Int. Cl.
*H10K 59/131* (2023.01)
*H10K 59/80* (2023.01)

(52) U.S. Cl.
CPC ....... *H10K 59/1315* (2023.02); *H10K 59/131* (2023.02); *H10K 59/805* (2023.02); *H10K 59/8052* (2023.02)

(58) Field of Classification Search
CPC .. H10K 59/131; H10K 59/1315; H10K 59/12; H10K 59/8052; H10K 59/82; H10K 59/00; H10K 59/80521; H10K 59/822; H10K 59/80522; H10K 59/824; H10K 59/80523; H10K 59/826; H10K 59/80524; H10K 59/828; H10K 59/124; H10K 59/35; H10D 86/441; H10D 86/60
See application file for complete search history.

(56) References Cited

U.S. PATENT DOCUMENTS

| | | | | |
|---|---|---|---|---|
| 8,674,346 | B2* | 3/2014 | Shin | H10K 59/1216 |
| | | | | 257/E51.001 |
| 11,921,951 | B2* | 3/2024 | Kadowaki | G06F 3/0412 |
| 2014/0132525 | A1* | 5/2014 | Pyo | G06F 3/0412 |
| | | | | 345/173 |
| 2018/0083194 | A1* | 3/2018 | Lee | H10K 71/70 |
| 2022/0302231 | A1* | 9/2022 | Son | H10K 59/131 |
| 2023/0127195 | A1* | 4/2023 | Lee | H10K 59/131 |
| | | | | 257/276 |

FOREIGN PATENT DOCUMENTS

| | | |
|---|---|---|
| CN | 110061152 A | 7/2019 |
| KR | 10-2005-0072007 A | 7/2005 |
| KR | 10-2015-0037150 A | 4/2015 |
| KR | 10-2015-0061756 A | 6/2015 |

* cited by examiner

*Primary Examiner* — Michael M Trinh
(74) *Attorney, Agent, or Firm* — Womble Bond Dickinson (US) LLP

(57) ABSTRACT

A display device according to one or more embodiments includes a substrate, common voltage lines on the substrate, and extending in a second direction, connection electrodes on the common voltage lines, an emission layer on the connection electrodes, a common electrode on the emission layer, and a voltage applying portion configured to apply a common voltage to the common electrode, wherein the emission layer defines openings for connection through which the common electrode is electrically connected with respective ones of the connection electrodes, and wherein distances between respective adjacent ones of the openings for connection increase as a distance from the voltage applying portion increases along the second direction.

20 Claims, 18 Drawing Sheets

DISPLAY DEVICE

CROSS-REFERENCE TO RELATED APPLICATION

This application claims priority to, and the benefit of, Korean Patent Application No. 10-2021-0179016 filed in the Korean Intellectual Property Office on Dec. 14, 2021, the entire contents of which are incorporated herein by reference.

BACKGROUND

1. Field

The present disclosure relates to a display device.

2. Description of the Related Art

A display device includes a display area including a plurality of pixels. Each pixel includes a pixel electrode to which a data signal is applied, a plurality of transistors, and at least one capacitor to transmit a data signal to the pixel electrode, and also includes a common electrode facing the pixel electrode. At least one layer may be located between the pixel electrode and the common electrode.

The common electrode may be formed as one electrode over a plurality of pixels to transmit a constant voltage.

The above information disclosed in this Background section is only for enhancement of understanding of the background of the described technology, and therefore it may contain information that does not form the prior art that is already known in this country to a person of ordinary skill in the art.

SUMMARY

Embodiments provide a display device that can provide a common voltage of substantially uniform magnitude to a plurality of pixels by reducing the deviation of the common voltage according to a voltage drop of the common voltage transmitted through a common electrode.

However, the problems to be solved by the embodiments are not limited to the above-described problems, and may be variously expanded in the range of the technical ideas included in the embodiments.

A display device according to one or more embodiments includes a substrate, common voltage lines on the substrate, and extending in a second direction, connection electrodes on the common voltage lines, an emission layer on the connection electrodes, a common electrode on the emission layer, and a voltage applying portion configured to apply a common voltage to the common electrode, wherein the emission layer defines openings for connection through which the common electrode is electrically connected with respective ones of the connection electrodes, and wherein distances between respective adjacent ones of the openings for connection increase as a distance from the voltage applying portion increases along the second direction.

The openings for connection may include a first opening for connection that is closest to the voltage applying portion, a second opening for connection closest to the first opening for connection along the second direction among the openings for connection, a sixth opening for connection that is furthest from the voltage applying portion with respect to the second direction, and a fifth opening for connection closest to the sixth opening for connection along the second direction among the openings for connection, and wherein a first distance between the first opening for connection and the second opening for connection is less than a fifth distance between the fifth opening for connection and the sixth opening for connection.

The openings for connection may further include a fourth opening for connection, and a third opening for connection closest to the fourth opening for connection along the second direction among the openings for connection, wherein the third opening for connection and the fourth opening for connection are between the second opening for connection and the fifth opening for connection, and wherein a third distance between the third opening for connection and the fourth opening for connection is greater than the first distance, and less than the fifth distance.

The openings for connection may further include two adjacent eighth openings for connection located near a center of the substrate along a first direction that is perpendicular to the second direction, and separated by a seventh distance along the first direction, and two adjacent ninth openings for connection located near an edge of the substrate along the first direction and separated by an eighth distance along the first direction, wherein the seventh distance is greater than the eighth distance.

The voltage applying portion may be at one side of the substrate along the second direction.

The voltage applying portion may include a pair of voltage applying portions at respective opposite sides of the substrate along the second direction.

The voltage applying portion may be at one side of the substrate along the second direction.

The voltage applying portion may include a pair of voltage applying portions at respective opposite sides of the substrate along the second direction.

The voltage applying portion may include a plurality of voltage applying portions on one side of the substrate along the second direction, and spaced apart from each other along a first direction that is perpendicular to the second direction.

The openings for connection may further include eighth openings for connection overlapping respective ones of the common voltage lines respectively connected to center portions of the voltage applying portions, and ninth openings for connection overlapping others of the common voltage lines respectively connected to edge portions of the voltage applying portions, wherein a distance between one of the eighth openings and one of the ninth openings that are adjacent to each other along a first direction that is perpendicular to the second direction is greater than a distance between two of the ninth openings that are adjacent to each other along the first direction.

The display device may further include sub-pixels representing different respective colors and including a transistor, and a light emitting diode that includes a pixel electrode, the emission layer, and the common electrode.

The connection electrodes may be in a same conductive layer as, and include a same material as, the pixel electrode.

The display device may further include an insulation layer between the pixel electrode and the emission layer, and defining an additional opening overlapping a first opening for connection of the openings for connection.

The first opening for connection may be within an edge of the additional opening in a plan view.

An edge of the first opening for connection and an edge of the additional opening may be aligned with each other.

A display device according to one or more embodiments includes a substrate, common voltage lines on the substrate, and extending in a second direction, connection electrodes on the common voltage lines, an emission layer on the connection electrode, a common electrode on the emission layer, and a voltage applying portion configured to apply a common voltage to the common electrode, wherein the emission layer defines openings for connection through which the common electrode is electrically connected with the connection electrode, and wherein distances between respective adjacent ones of the openings for connection along a first direction that is perpendicular to the second direction is greater near a center portion of the substrate, and smaller near an edge of the substrate.

A distance between two of the openings for connection closest to each other along the first direction and located at the center portion of the substrate may be greater than a distance between two of the openings for connection closest to each other along the first direction and located at edges of the substrate along the first direction.

The voltage applying portion may be at one side of the substrate along the second direction.

The voltage applying portion may include a pair of voltage applying portions at respective opposite sides of the substrate along the second direction.

The voltage applying portion may include a plurality of voltage applying portions at one side of the substrate along the second direction, and spaced apart from each other along the first direction.

In the display device according to one or more embodiments, the common voltage of substantially uniform magnitude can be provided to a plurality of pixels by reducing the deviation of the common voltage according to a voltage drop of the common voltage transmitted through the common electrode.

However, the aspects of the embodiments are not limited to the above-described effects, and it is evident that the embodiments can be variously expanded within a range that does not deviate from the spirit and region of the embodiments.

DETAILED DESCRIPTION

Figure 1:
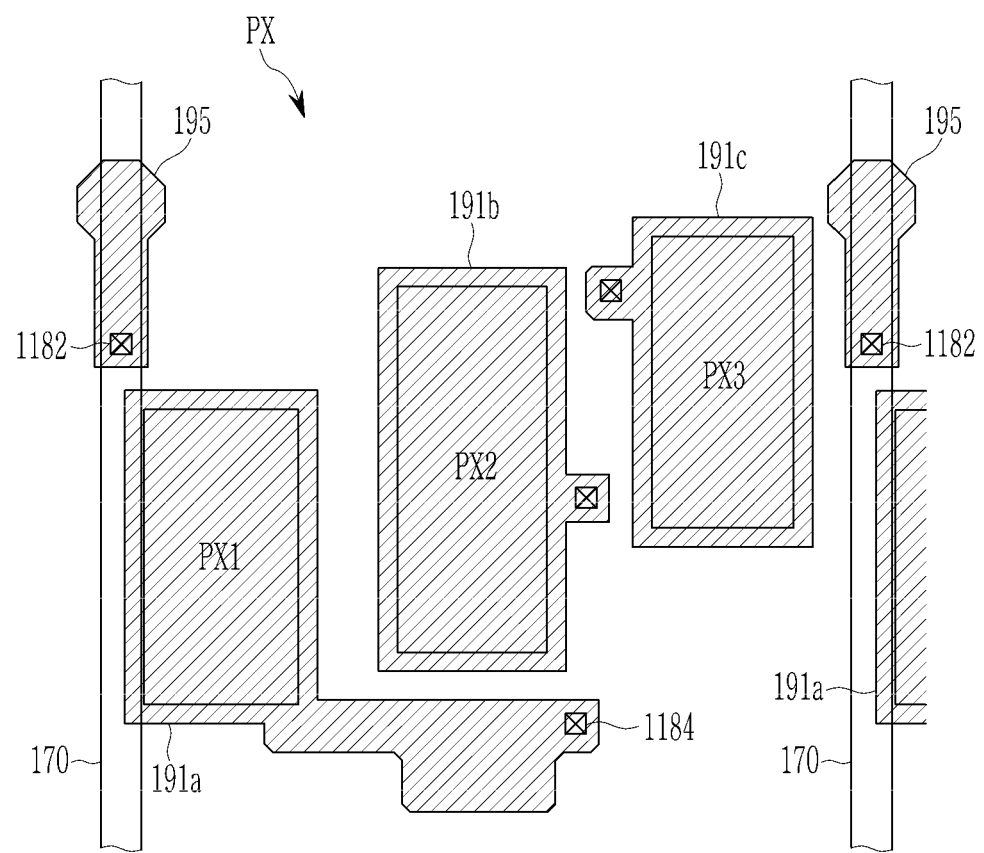
FIG. 1 is a top plan view of an electrode layer and a common voltage line position in a pixel of a display area of a display device according to one or more embodiments.

Aspects of some embodiments of the present disclosure and methods of accomplishing the same may be understood more readily by reference to the detailed description of embodiments and the accompanying drawings. Hereinafter, embodiments will be described in more detail with reference to the accompanying drawings. The described embodiments, however, may have various modifications and may be embodied in various different forms, and should not be construed as being limited to only the illustrated embodiments herein. Rather, these embodiments are provided as examples so that this disclosure will be thorough and complete, and will fully convey the aspects of the present disclosure to those skilled in the art, and it should be understood that the present disclosure covers all the modifications, equivalents, and replacements within the idea and technical scope of the present disclosure. Accordingly, processes, elements, and techniques that are not necessary to those having ordinary skill in the art for a complete understanding of the aspects of the present disclosure may not be described.

Unless otherwise noted, like reference numerals, characters, or combinations thereof denote like elements throughout the attached drawings and the written description, and thus, descriptions thereof will not be repeated. Further, parts that are not related to, or that are irrelevant to, the description of the embodiments might not be shown to make the description clear.

In the drawings, the relative sizes of elements, layers, and regions may be exaggerated for clarity. Additionally, the use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified.

Various embodiments are described herein with reference to sectional illustrations that are schematic illustrations of embodiments and/or intermediate structures. As such, variations from the shapes of the illustrations as a result, for example, of manufacturing techniques and/or tolerances, are to be expected. Further, specific structural or functional descriptions disclosed herein are merely illustrative for the purpose of describing embodiments according to the concept of the present disclosure. Thus, embodiments disclosed herein should not be construed as limited to the particular illustrated shapes of regions, but are to include deviations in shapes that result from, for instance, manufacturing.

For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place.

Thus, the regions illustrated in the drawings are schematic in nature and their shapes are not intended to illustrate the actual shape of a region of a device and are not intended to be limiting. Additionally, as those skilled in the art would realize, the described embodiments may be modified in various different ways, all without departing from the spirit or scope of the present disclosure.

In the detailed description, for the purposes of explanation, numerous specific details are set forth to provide a thorough understanding of various embodiments. It is apparent, however, that various embodiments may be practiced without these specific details or with one or more equivalent arrangements. In other instances, well-known structures and devices are shown in block diagram form in order to avoid unnecessarily obscuring various embodiments.

Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. Similarly, when a first part is described as being arranged "on" a second part, this indicates that the first part is arranged at an upper side or a lower side of the second part without the limitation to the upper side thereof on the basis of the gravity direction.

Further, in this specification, the phrase "on a plane," or "plan view," means viewing a target portion from the top, and the phrase "on a cross-section" means viewing a cross-section formed by vertically cutting a target portion from the side.

It will be understood that when an element, layer, region, or component is referred to as being "formed on," "on," "connected to," or "coupled to" another element, layer, region, or component, it can be directly formed on, on, connected to, or coupled to the other element, layer, region, or component, or indirectly formed on, on, connected to, or coupled to the other element, layer, region, or component such that one or more intervening elements, layers, regions, or components may be present. In addition, this may collectively mean a direct or indirect coupling or connection and an integral or non-integral coupling or connection. For example, when a layer, region, or component is referred to as being "electrically connected" or "electrically coupled" to another layer, region, or component, it can be directly electrically connected or coupled to the other layer, region, and/or component or intervening layers, regions, or components may be present. However, "directly connected/directly coupled," or "directly on," refers to one component directly connecting or coupling another component, or being on another component, without an intermediate component. Meanwhile, other expressions describing relationships between components such as "between," "immediately between" or "adjacent to" and "directly adjacent to" may be construed similarly. In addition, it will also be understood that when an element or layer is referred to as being "between" two elements or layers, it can be the only element or layer between the two elements or layers, or one or more intervening elements or layers may also be present.

For the purposes of this disclosure, expressions such as "at least one of," when preceding a list of elements, modify the entire list of elements and do not modify the individual elements of the list. For example, "at least one of X, Y, and Z," "at least one of X, Y, or Z," and "at least one selected from the group consisting of X, Y, and Z" may be construed as X only, Y only, Z only, any combination of two or more of X, Y, and Z, such as, for instance, XYZ, XYY, YZ, and ZZ, or any variation thereof. Similarly, the expression such as "at least one of A and B" may include A, B, or A and B. As used herein, "or" generally means "and/or," and the term "and/or" includes any and all combinations of one or more of the associated listed items. For example, the expression such as "A and/or B" may include A, B, or A and B.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure. The description of an element as a "first" element may not require or imply the presence of a second element or other elements. The terms "first", "second", etc. may also be used herein to differentiate different categories or sets of elements. For conciseness, the terms "first", "second", etc. may represent "first-category (or first-set)", "second-category (or second-set)", etc., respectively.

In the examples, the x-axis, the y-axis, and/or the z-axis are not limited to three axes of a rectangular coordinate system, and may be interpreted in a broader sense. For example, the x-axis, the y-axis, and the z-axis may be perpendicular to one another, or may represent different directions that are not perpendicular to one another. The same applies for first, second, and/or third directions.

The terminology used herein is for the purpose of describing particular embodiments only and is not intended to be limiting of the present disclosure. As used herein, the singular forms "a" and "an" are intended to include the plural forms as well, unless the context clearly indicates otherwise. It will be further understood that the terms "comprises," "comprising," "have," "having," "includes," and "including," when used in this specification, specify the presence of the stated features, integers, steps, operations, elements, and/or components, but do not preclude the presence or addition of one or more other features, integers, steps, operations, elements, components, and/or groups thereof.

When one or more embodiments may be implemented differently, a specific process order may be performed differently from the described order. For example, two consecutively described processes may be performed substantially at the same time or performed in an order opposite to the described order.

As used herein, the term "substantially," "about," "approximately," and similar terms are used as terms of approximation and not as terms of degree, and are intended to account for the inherent deviations in measured or calculated values that would be recognized by those of ordinary skill in the art. "About" or "approximately," as used herein, is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value. Further, the use of "may" when describing embodiments of the present disclosure refers to "one or more embodiments of the present disclosure."

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

Figure 2:
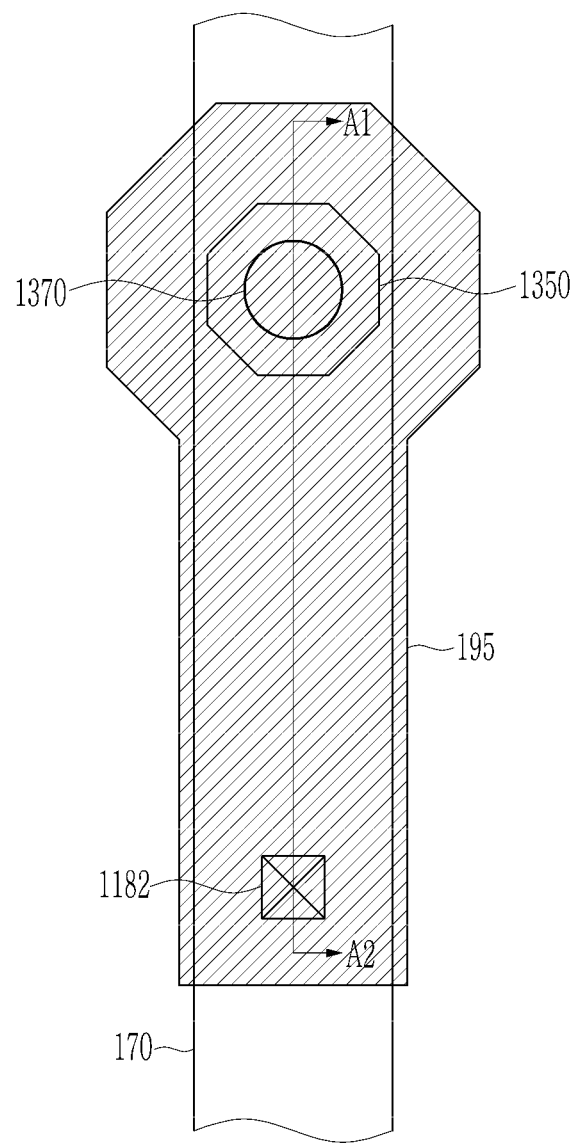
FIG. 2 is a top plan view of a connection electrode of the display device according to one or more embodiments.
Figure 3:
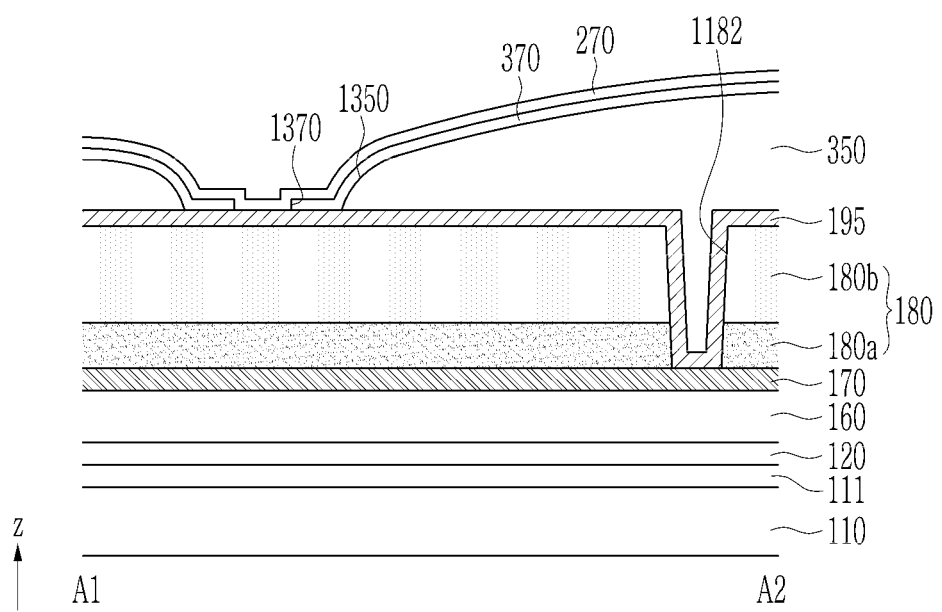
FIG. 3 is a cross-sectional view of the display device shown in FIG. 2, taken along the line A1-A2.
Figure 4:
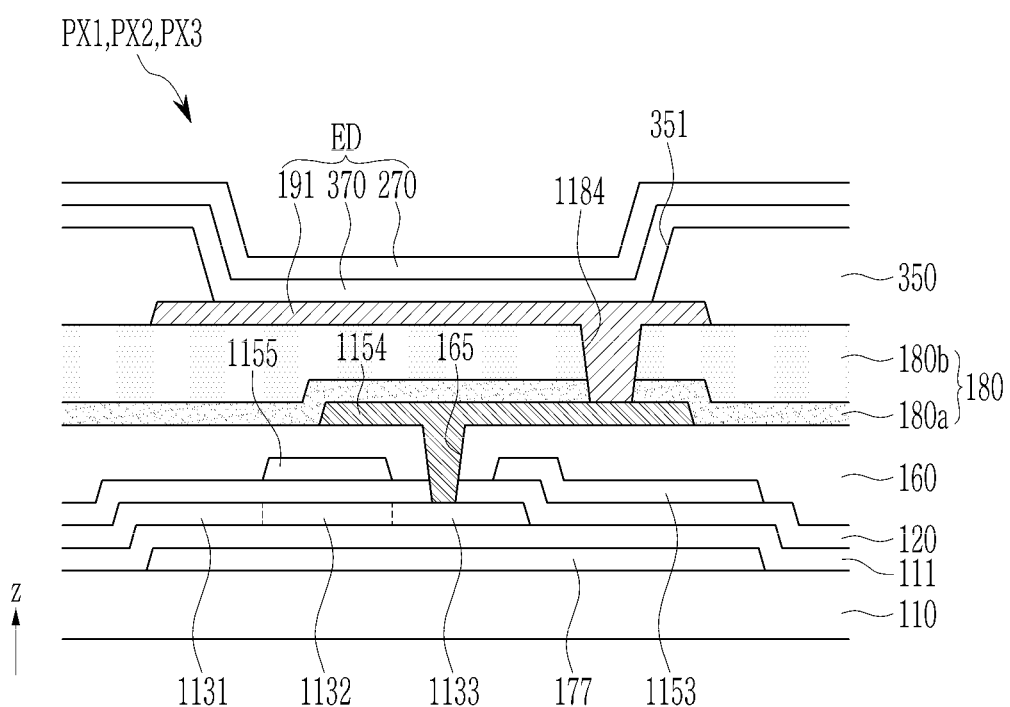
FIG. 4 is a cross-sectional view of a pixel of the display device according to one or more embodiments.

Referring to FIG. 1 to FIG. 4, a display device according to one or more embodiments will be described. FIG. 1 is a top plan view of an electrode layer and a common voltage line position in a pixel of a display area of a display device according to one or more embodiments, FIG. 2 is a top plan view of a connection electrode of the display device according to one or more embodiments, FIG. 3 is a cross-sectional view of the display device shown in FIG. 2, taken along the line A1-A2, and FIG. 4 is a cross-sectional view of a pixel of the display device according to one or more embodiments.

Referring to FIG. 1, a display device according to one or more embodiments includes a plurality of pixels PX that can display an image.

Referring to FIG. 1, each pixel PX may include a plurality of sub-pixels PX1, PX2, and PX3. A plurality of sub-pixels PX1, PX2, and PX3 included in each pixel PX may respectively display light of different colors. For example, a plurality of sub-pixels PX1, PX2, and PX3 may respectively display basic colors such as red, green, and blue. The plurality of sub-pixels PX1, PX2, and PX3 may display various colors by combining various luminances of different primary colors.

The sub-pixels PX1, PX2, and PX3 include pixel electrodes 191a, 191b, and 191c to which a data signal having luminance information of light to be displayed can be applied, and a plurality of transistors electrically connected thereto. The plurality of pixel electrodes 191a, 191b, and 191c may be located on the same layer, and may be located on a pixel electrode layer including the same material.

Each of the pixel electrodes 191a, 191b, and 191c may be electrically connected to a transistor formed in each of the sub-pixels PX1, PX2, and PX3 through an opening 1184, which is a hole formed in at least one insulation layer located below each of the pixel electrodes 191a, 191b, and 191c.

The display device according to one or more embodiments includes a plurality of common voltage lines 170 transmitting a common voltage, and a plurality of connection electrodes 195.

The common voltage line 170 may extend lengthwise in a second direction y. One common voltage line 170 may be located at least for each pixel PX in a first direction x.

The connection electrode 195 may be located in at least each pixel PX in the first direction x or the second direction y.

The connection electrode 195 may be located in a conductive layer that is different from that of the common voltage line 170.

At least a portion of each connection electrode 195 overlaps the common voltage line 170 in a third direction z that is perpendicular to the first direction x and the second direction y. The portion of the connection electrode 195 overlapping the common voltage line 170 may be electrically connected to the common voltage line 170 through an opening 1182 of the at least one insulation layer located between the common voltage line 170 and the connection electrode 195.

The connection electrode 195 overlapping an opening for connection 1370 is electrically connected with the common voltage line 170 located below the connection electrode 195 through the opening 1182.

A portion of the connection electrode 195, which does not overlap with the opening for connection 1370, may also be electrically connected with the common voltage line 170 through the opening 1182. However, according to one or more other embodiments, at least some portions of the connection electrodes 195 that do not overlap with the opening for connection 1370 may not overlap with the opening 1182.

According to one or more other embodiments, at least some portions of the connection electrode 195 that are not electrically connected to the common voltage line 170 or that do not overlap with the opening for connection 1370 may be omitted.

The connection electrode 195 may be located in a conductive layer that is different from that of the common voltage line 170, and may be located in the same conductive layer as that of the pixel electrodes 191a, 191b, and 191c, and may contain the same conducting material as the pixel electrodes 191a, 191b, and 191c, but is not limited thereto.

Hereinafter, a structure of the display device according to one or more embodiments will be described in more detail with reference to FIG. 2 to FIG. 4.

The display device according to one or more embodiments may include a substrate 110 that includes an insulating material, and a buffer layer 111, which is an insulation layer, may be located on the substrate 110.

A first conductive layer that includes a light blocking pattern 177 may be located between the substrate 110 and the buffer layer 111.

A semiconductor layer that includes a channel region 1132, and conductive regions 1131 and 1133 that are located at respective opposite sides of the channel region 1132, may be located on the buffer layer 111. With reference to one channel region 1132, a conductive region 1131 located on one side may be a source region, and a conductive region 1133 located on the other side may be a drain region, and vice versa.

A first insulation layer 120 may be located on the semiconductor layer.

A second conductive layer that includes a gate electrode 1155 and a lower electrode 1153 may be located on the first insulation layer 120. The gate electrode 1155 may overlap the channel region 1132 in the third direction z. The gate electrode 1155 may be electrically connected to the lower electrode 1153, and may be formed integrally.

The channel region 1132, the conductive regions 1131 and 1133, and the gate electrode 1155 together may form one transistor.

A second insulation layer 160 may be located on the gate electrode 1155 and the lower electrode 1153.

A third conductive layer that includes an upper electrode 1154 and the common voltage line 170 may be located on the second insulation layer 160.

The upper electrode 1154 may overlap the lower electrode 1153 and the second insulation layer 160 to form a capacitor. The lower electrode 1153 may also overlap the light blocking pattern 177, while the first insulation layer 120 is located therebetween.

The upper electrode 1154 may be electrically connected to the conductive region 1133 of the transistor through an opening 165 formed in the second insulation layer 160 and in the first insulation layer 120.

A third insulation layer 180 may be located on the common voltage line 170 and the upper electrode 1154. The third insulation layer 180 may include a first protective layer 180a and a second protective layer 180b.

The third insulation layer 180 includes, or defines, a plurality of openings 1184, and also includes, or defines, a plurality of openings 1182 located above the common voltage line 170.

At least one of the first conductive layer, the second conductive layer, and the third conductive layer may include at least one of a metal including copper (Cu), aluminum (Al), magnesium (Mg), silver (Ag), gold (Au), platinum (Pt), palladium (Pd), nickel (Ni), neodymium Nd, iridium (Ir), molybdenum (Mo), tungsten (W), titanium (Ti), chromium (Cr), and tantalum (Ta), an alloy thereof, and a metal oxide such as an indium tin oxide (ITO) and an indium zinc oxide (IZO). Each of the first conductive layer, the second conductive layer, and the third conductive layer may be formed of a single layer or multiple layers. For example, at least one of the first conductive layer, the second conductive layer, and the third conductive layer may have a multilayer structure including a lower layer including titanium, an intermediate layer including copper, and an upper layer including ITO.

At least one of the buffer layer 111, the first insulation layer 120, the second insulation layer 160, and the third insulation layer 180 may include an inorganic insulation material such as silicon nitride ($SiN_x$), silicon oxide ($SiO_x$), silicon oxynitride ($SiO_xN_y$), and the like and/or an organic insulation material such as polyimide, an acryl-based polymer, and a siloxane-based polymer. The first protective layer 180a of the third insulation layer 180 may be formed of an inorganic insulating material, and the second protective layer 180b may be formed of an organic insulating material.

A fourth conductive layer including the connection electrode 195 may be located on the third insulation layer 180.

The connection electrode 195 may be electrically connected to the common voltage line 170 through the opening 1182.

A plurality of pixel electrodes 191 may be located on the third insulation layer 180. The pixel electrode 191 may include a plurality of pixel electrodes 191a, 191b, and 191c shown FIG. 1.

According to one or more embodiments, the plurality of pixel electrodes 191 may be formed of a conductive layer such as that including the connection electrode 195. That is, the pixel electrodes 191 may be formed of the fourth conductive layer. For example, the pixel electrode 191 includes the same material as, and may be formed together in the same process as, that of the connection electrode 195. In this case, the fourth conductive layer may include a transparent metal oxide, such as an indium tin oxide (ITO) or an indium zinc oxide (IZO).

For example, the fourth conductive layer may be formed of a multilayer or a single layer, such as a triple layer in which a layer containing ITO, a layer containing silver (Ag), and a layer containing ITO are sequentially stacked.

Alternatively, the pixel electrode 191 and the connection electrode 195 may contain different conducting materials by positioning them on different conductive layers.

The pixel electrode 191 may be electrically connected to the upper electrode 1154 through the opening 1184.

A fourth insulation layer 350 may be located on the connection electrode 195 and the pixel electrode 191. The fourth insulation layer 350 may include an organic insulating material, such as a polyacryl-based resin or a polyimide-based resin.

The fourth insulation layer 350 has, or defines, an opening 1350 that overlaps with the connection electrode 195 in the third direction z, and an opening 351 that overlaps with the pixel electrode 191. The opening 1350 may be spaced apart from the opening 1182 of the third insulation layer 180 in the xy plane view.

An emission layer 370 may be located on the fourth insulation layer 350. The emission layer 370 is located entirely over most of the substrate 110, but has an opening for connection 1370 that overlaps the connection electrode 195.

The opening for connection 1370 of the emission layer 370 may overlap at least a portion of the opening 1350 of the fourth insulation layer 350. Referring to FIG. 3 and FIG. 4, the opening for connection 1370 of the emission layer 370 may be located within an edge of the opening 1350 of the fourth insulation layer 350. In this case, a part of the emission layer 370 may be located in the opening 1350 of the fourth insulation layer 350.

In one or more other embodiments, a portion of the opening for connection 1370 of the emission layer 370 may overlap a portion of the edge of the opening 1350 of the fourth insulation layer 350.

The emission layer 370 may include an organic light emitting material or an inorganic light emitting material.

The emission layer 370 may be located within the opening 351 of the fourth insulation layer 350 to be in contact with the pixel electrode 191.

A common electrode 270 is located on the emission layer 370.

The common electrode 270 may be located entirely on the substrate 110.

The common electrode 270 may be electrically connected to the connection electrode 195 through the opening for connection 1370 of the emission layer 370. The common electrode 270 may be electrically connected to the common voltage line 170 through the connection electrode 195 to receive a common voltage.

The common electrode 270 may include a metallic material including silver (Ag) or a transparent metal oxide, such as an indium tin oxide (ITO) or an indium zinc oxide (IZO).

A thickness of the third direction z of the common electrode 270 may be about 150 angstroms or less, but is not limited thereto.

The common electrode 270 may be in contact with the emission layer 370.

A pixel electrode 191, an emission layer 370, and a common electrode 270 of each of the sub-pixels PX1, PX2, and PX3 may form a light emitting diode ED together. In this case, the pixel electrode 191 may be an anode, and the common electrode 270 may be a cathode.

Figure 5:
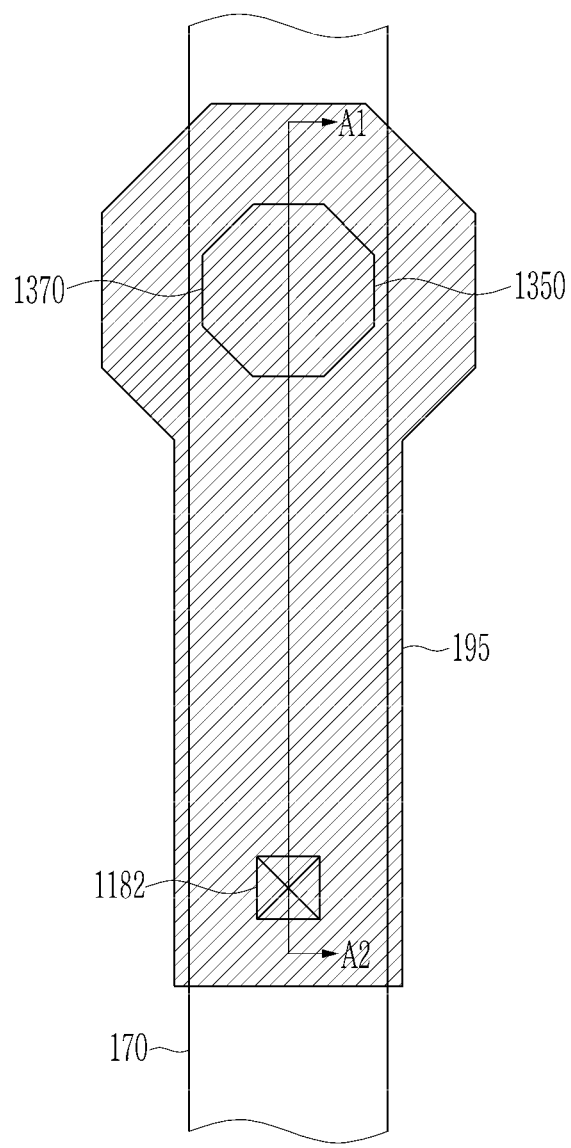
FIG. 5 is a top plan view of a connection electrode of a display device according to one or more other embodiments.
Figure 6:
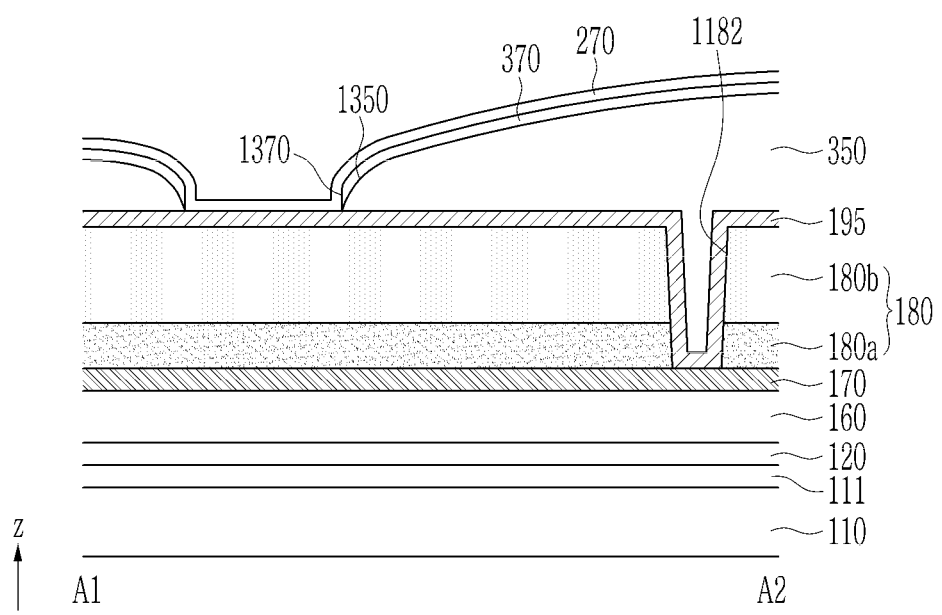
FIG. 6 and FIG. 7 are cross-sectional views of the display device of FIG. 5, taken along the line A1-A2.
Figure 7:
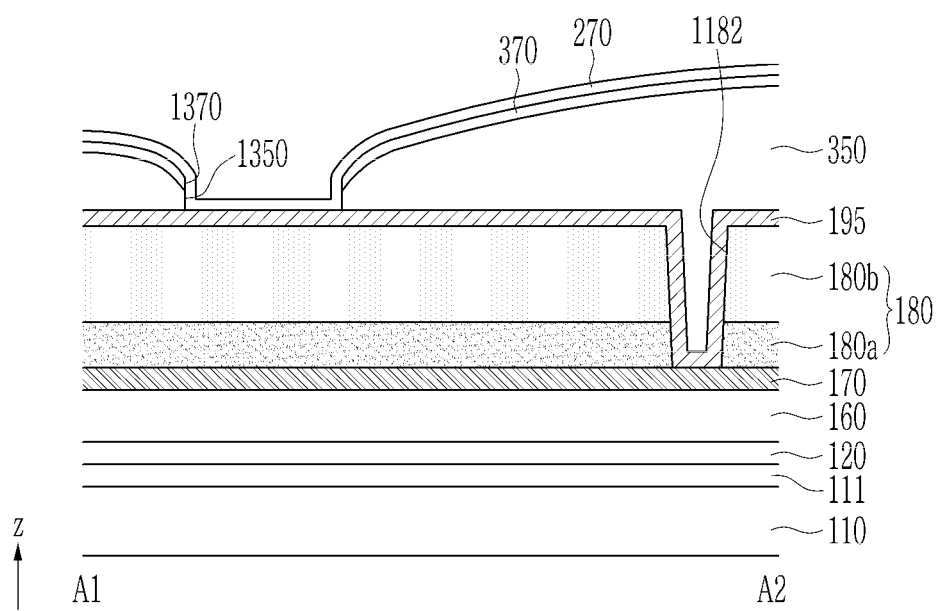

Referring to FIG. 5, FIG. 6, and FIG. 7, a display device according to one or more other embodiments will be described.

FIG. 5 is a top plan view of a connection electrode of a display device according to one or more other embodiments, and FIG. 6 and FIG. 7 are cross-sectional views of the display device of FIG. 5, taken along the line A1-A2.

Referring to FIG. 5 to FIG. 7, a display device according to the present example is almost the same as the display device shown in FIG. 1 to FIG. 4, except that an opening for connection 1370 of an emission layer 370 substantially matches an edge of a fourth insulation layer opening 1350. Therefore, the emission layer 370 may not be substantially located in the opening 1350 of the fourth insulation layer 350.

The shape of the side of the opening 1350 of the fourth insulation layer 350 may be made to be obliquely inclined as shown in FIG. 6, and may form a substantially flat surface with the side of the opening for connection 1370 as shown in FIG. 7.

Figure 8:
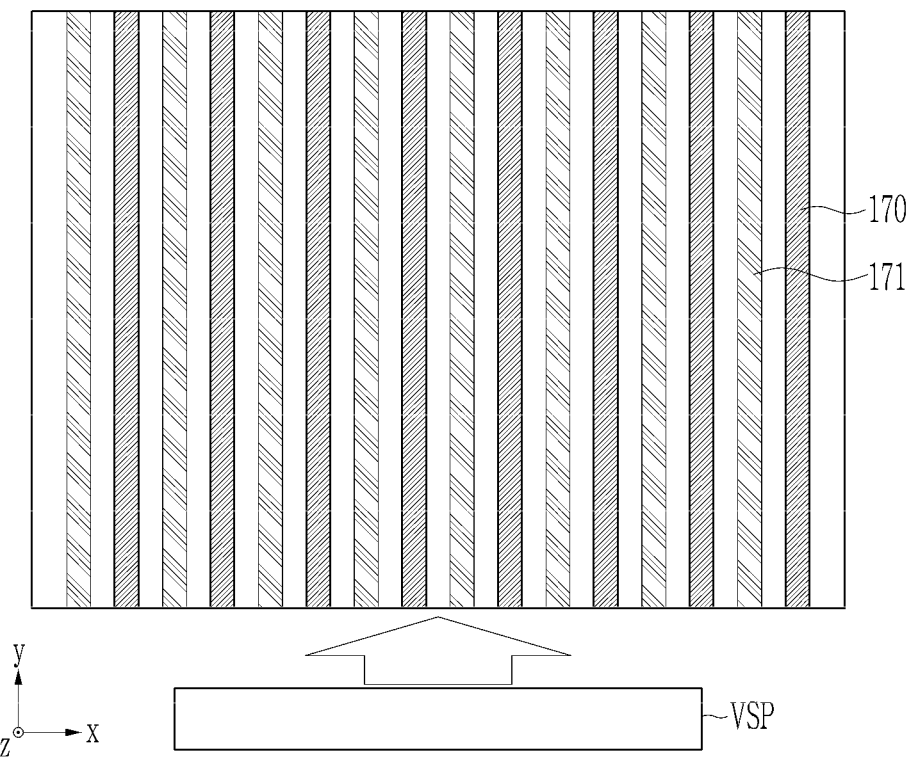
FIG. 8 is a top plan view of some signal lines of a display device according to one or more embodiments.
Figure 9:
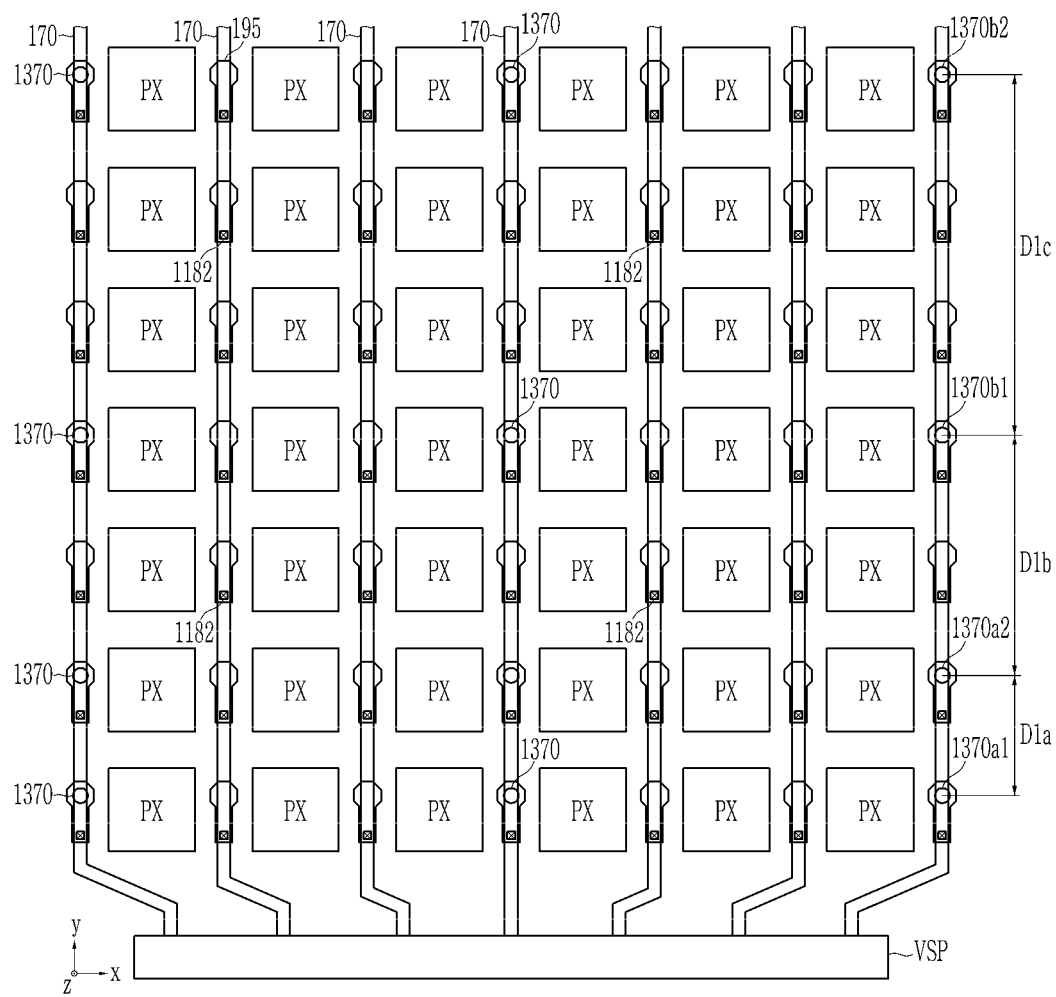
FIG. 9 is a top plan view of a plurality of pixels and a plurality of connection electrodes of a display area of the display device according to one or more embodiments.

Next, referring to FIG. 8 and FIG. 9, together with FIG. 1 to FIG. 7, alignment of signal lines of a display device, a plurality of pixels, and a plurality of connection electrodes according to one or more embodiments will be described. FIG. 8 is a top plan view of some signal lines of a display device according to one or more embodiments, and FIG. 9 is a top plan view of a plurality of pixels and a plurality of connection electrodes of a display area of the display device according to one or more embodiments.

Referring to FIG. 8, a display device according to one or more embodiments may include a plurality of common voltage lines 170 and a plurality of driving voltage lines 171.

The plurality of common voltage lines 170 and the plurality of driving voltage lines 171 may extend in a second direction y, and may receive a common voltage VSS and a common voltage VDD from a driving voltage applying portion VSP that is located at one side of a display panel 100 of the display device along the second direction y.

Accordingly, the common voltage VSS applied from the driving voltage applying portion VSP is transmitted toward an opposite direction facing from one side of the display panel 100 where the driving voltage applying portion VSP is located along the second direction y, as shown by the arrow in FIG. 8.

Referring to FIG. 9, a plurality of pixels PX may be arranged, substantially, in a matrix form, but are not limited thereto, and may be repeatedly arranged according to a certain rule.

FIG. 9 shows an example in which one connection electrode 195 is formed for each pixel PX in each of the first direction x and the second direction y.

Referring to FIG. 9, an opening for connection 1370 of an emission layer may be located on a part of the plurality of connection electrodes 195 that overlap the plurality of common voltage lines 170.

A common electrode 270 formed in the entire plurality of pixels PX of the display device may be connected to the connection electrodes 195 through a plurality of openings for connection 1370, and may be connected to the plurality of common voltage lines 170 through the connection electrodes 195.

Thus, the common electrode 270 may be applied with the common voltage VSS through the plurality of common voltage lines 170.

A distance between two openings for connection 1370 adjacent to each other along the second direction y among the plurality of openings for connection 1370 for connecting the common electrode 270 and the connection electrode 195 may not be constant depending on positions.

The plurality of openings for connection 1370 may include a first opening for connection 1370a1 located closest to the driving voltage applying portion VSP, a second opening for connection 1370a2 located adjacent to the first opening for connection 1370a1 along the second direction y in which the common voltage line 170 extends, a third opening for connection 1370b1 located adjacent to the second opening for connection 1370a2 along the second direction y, and a fourth opening for connection 1370b2 located adjacent to the third opening for connection 1370b1 along the second direction y.

Among the plurality of openings for connection 1370, a second distance D1b between the second opening for connection 1370a2 and the third opening for connection 1370b1 may be greater than a first distance D1a between the first opening for connection 1370a1 and the second opening for connection 1370a2, and a third distance D1c between the third opening for connection 1370b1 and the fourth opening for connection 1370b2 may be greater than the second distance D1b.

As previously described, the common voltage VSS applied from the driving voltage applying portion VSP is sequentially transmitted from one side of the display panel 100, where the driving voltage applying portion VSP is located, to another opposing side along the second direction y.

The common voltage VSS supplied from the driving voltage applying portion VSP may be sequentially transmitted from a pixel PX closest to the driving voltage applying portion VSP to a pixel PX located farthest from the driving voltage applying portion VSP. In this case, the common voltage VSS is continuously transmitted to the pixel PX closest to the driving voltage applying portion VSP until the common voltage VSS is applied to the pixel PX located farthest from the driving voltage applying portion VSP. Therefore, the closer the pixel PX to the driving voltage applying portion VSP, the greater the magnitude of the common voltage VSS, and the greater the magnitude of the common voltage VSS, the greater the intensity of the current. Because the effect of a voltage drop is increased as the intensity of the current applied by the common voltage VSS is increased, it may be suitable to reduce the effect of the voltage drop by reducing the intensity of the resistance.

Therefore, it may be suitable to further reduce the voltage drop of the common voltage VSS as the position of the pixel PX is closer to the driving voltage applying portion VSP.

In the display device according to the present example, the distance between the plurality of openings for connection 1370 may not be constant, and the distance between two adjacent openings for connection 1370 may vary depending on the position of the plurality of openings for connection 1370.

For example, as shown in FIG. 9, as the position of the plurality of openings for connection 1370 is closer to the driving voltage applying portion VSP, the distance between the two adjacent openings for connection 1370 may decrease, and as the position of the plurality of openings for connection 1370 is farther from the driving voltage applying portion VSP, the distance between two adjacent openings for connection 1370 may increase. As described, as the distance of the plurality of openings for connection 1370 from the driving voltage applying portion VSP increases, the distance between the two adjacent openings for connection 1370 may sequentially increase.

Therefore, the closer the position of the pixels PX to the driving voltage applying portion VSP, the greater the number of connection portions between the common electrode 270 and the common voltage line 170. Accordingly, as the position of the pixel PX is closer to the driving voltage applying portion VSP, the degree of the voltage drop of the common voltage VSS may be further reduced.

As such, in the display device according to the present example, it is possible to reduce the voltage drop difference of the common voltage VSS applied to the common electrode 270 according to the position of the display device, and thus there is little to no deviation in the magnitude of the common voltage VSS according to the position of the display device. Therefore, it is possible to reduce or prevent display quality deterioration due to magnitude deviation of the common voltage VSS.

Figure 10:
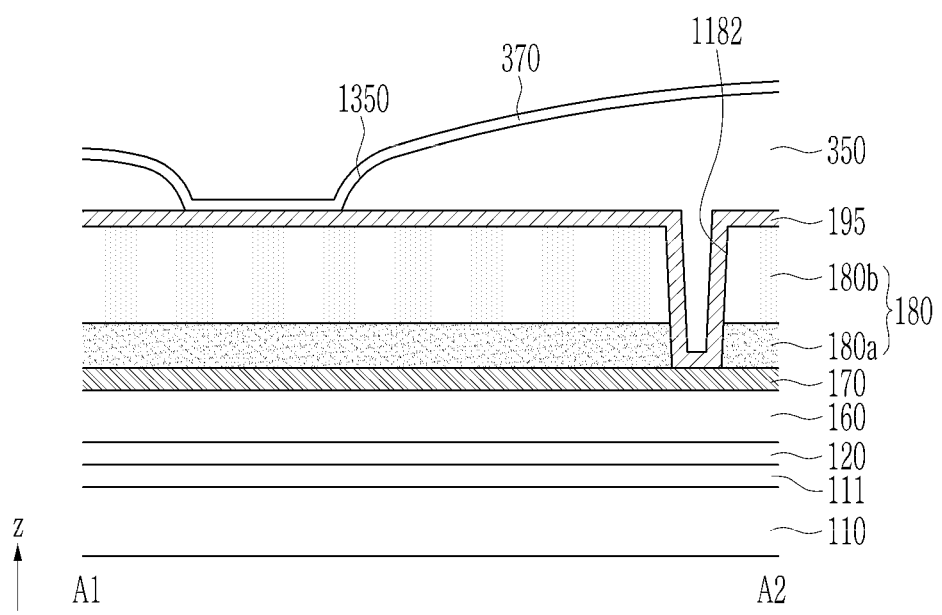
FIG. 10 illustrates a laser drilling process in a manufacturing method of the display device according to one or more embodiments.

Next, a manufacturing method of the display device according to one or more embodiments will be described with reference to FIG. 10 and FIG. 11. FIG. 10 illustrates a laser drilling process in a manufacturing method of the display device according to one or more embodiments, and FIG. 11 illustrates the display device after laser drilling in the manufacturing method of the display device according to one or more embodiments.

Referring to FIG. 10, the plurality of common voltage lines 170, the plurality of connection electrodes 195, and the like are formed on the substrate 110, and then the fourth insulation layer 350 is formed on the connection electrode 195 and patterned such that the opening 1350 is formed.

Then, the emission layer 370 is stacked on the fourth insulation layer 350.

Figure 11:
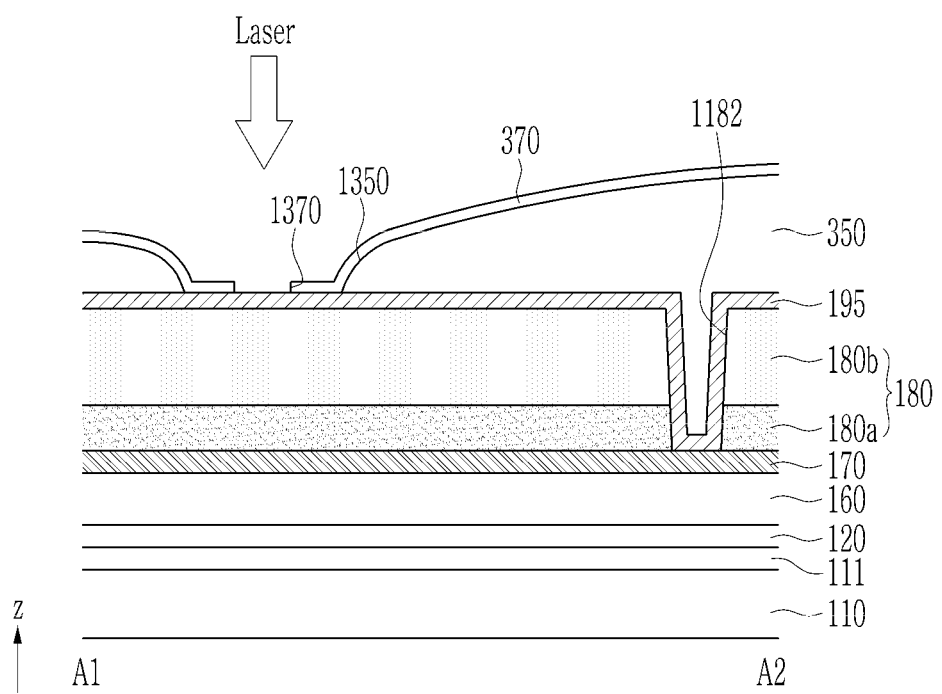
FIG. 11 illustrates the display device after laser drilling in the manufacturing method of the display device according to one or more embodiments.

Next, as shown in FIG. 11, a portion of the emission layer 370, corresponding to the fourth insulation layer 350, is removed to form the opening for connection 1370. As a method of forming the opening for connection 1370, for example, a laser drilling process for forming the opening for connection 1370 by irradiating a laser may be used. In this case, particles of the emission layer 370 that are removed by the laser may be generated.

In the case of one or more embodiments shown in FIG. 5 to FIG. 7, after stacking the fourth insulation layer 350, the emission layer 370 is stacked on the fourth insulation layer 350 without forming the opening 1350. Thereafter, the emission layer 370 and the fourth insulation layer 350 on the connection electrode 195 may be removed together using a process such as laser drilling. Accordingly, the opening for connection 1370 of the emission layer 370 and the opening 1350 of the fourth insulation layer 350 may be formed in alignment with each other.

After forming the opening for connection 1370, the common electrode 270 is formed on the emission layer 370 as previous described with reference to FIG. 3, FIG. 6, and FIG. 7.

Figure 12:
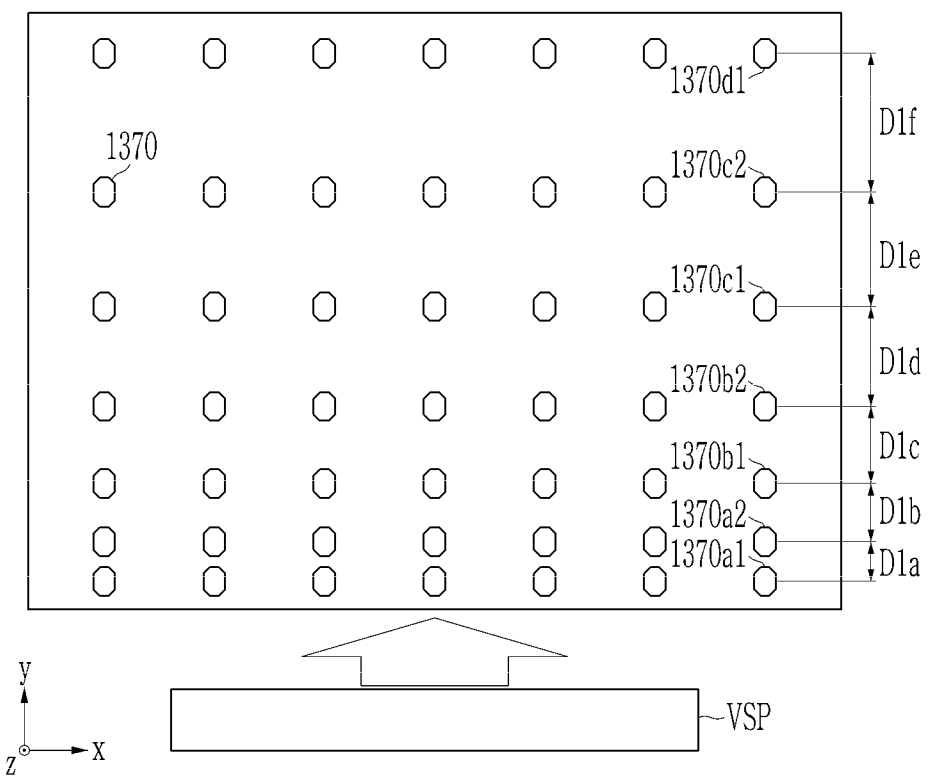
FIG. 12 is a top plan view of alignment of the openings for connection of the common electrode of the display device according to one or more embodiments.

Hereinafter, the opening for connection 1370 of the emission layer 370 of the display device according to one or more embodiments will be described in more detail with reference to FIG. 12, together with the above described FIG. 1 to FIG. 8. FIG. 12 is a top plan view of alignment of the openings for connection of the common electrode of the display device according to one or more embodiments.

Referring to FIG. 12, a distance between two openings for connection 1370 adjacent to each other along the second direction y, among the plurality of openings for connection 1370 for connecting the common electrode 270 and the connection electrode 195, may not be constant depending on positions.

The plurality of openings for connection 1370 may include a first opening for connection 1370a1 located closest to the driving voltage applying portion VSP, a second opening for connection 1370a2 located adjacent to the first opening for connection 1370a1 along the second direction y in which the common voltage line 170 extends, a third opening for connection 1370b1 located adjacent to the second opening for connection 1370a2 along the second direction y, a fourth opening for connection 1370b2 located adjacent to the third opening for connection 1370b1 along the second direction y, a fifth opening for connection 1370c1 located adjacent to the fourth opening for connection 1370b2 along the second direction y, a sixth opening for connection 1370c2 located adjacent to the fifth opening for connection 1370c1 along the second direction y, and a seventh opening for connection 1370d1 located adjacent to the sixth opening for connection 1370c2 along the second direction y.

In the illustrated example, seven openings for connection 1370 are included along the second direction y, but one or more embodiments is not limited thereto, and a plurality of openings for connection 1370 may be located along the second direction y.

Among the plurality of openings for connection 1370, a second distance D1b between the second opening for connection 1370a2 and the third opening for connection 1370b1 may be greater than a first distance D1a between the first opening for connection 1370a1 and the second opening for connection 1370a2, and a third distance D1c between the third opening for connection 1370b1 and the fourth opening for connection 1370b2 may be greater than the second distance D1b.

A fourth distance D1d between the fourth opening for connection 1370b2 and the fifth opening for connection 1370c1 may be greater than the third distance D1c, a fifth distance D1e between the fifth opening for connection 1370c1 and the sixth opening for connection 1370c2 may be greater than the fourth distance Did, and a sixth distance D1f between the sixth opening for connection 1370c2 and the seventh opening for connection 1370d1 may be greater than the fifth distance D1e.

As described, a distance between two openings for connection 1370 that are adjacent to each other along the second direction y may be different depending on the position of the openings for connection 1370, as the position of the plurality of openings for connection 1370 is closer to the driving voltage applying portion VSP, the distance between the two adjacent openings for connection 1370 may become smaller, and as the position of the plurality of openings for connection 1370 is farther from the driving voltage applying portion VSP, the distance between two adjacent openings for connection 1370 may become greater, and as the positions of the plurality of openings for connection 1370 move away from the driving voltage applying portion VSP, the distance between the two adjacent openings for connection 1370 may sequentially increase.

As previously described, the common voltage VSS, which is applied from the driving voltage applying portion VSP, is transmitted toward one side of the display panel 100 that is opposite to the side where the driving voltage applying portion VSP is located, with respect to the second direction y, as shown by the arrow in FIG. 8.

In this case, the closer the position of the pixel PX to the driving voltage applying portion VSP, the greater the number of connection portions between the common electrode 270 and the common voltage line 170. Accordingly, as the position of the pixel PX is closer to the driving voltage applying portion VSP, the degree of the voltage drop of the common voltage VSS may be further reduced.

As such, in the display device according to the present example, it is possible to reduce the voltage drop difference of the common voltage VSS applied to the common electrode 270 according to the position of the display device, and thus there may be little to no deviation in the magnitude of the common voltage VSS according to the position of the display device. Therefore, it is possible to reduce or prevent display quality deterioration due to magnitude deviation of the common voltage VSS.

Figure 13:
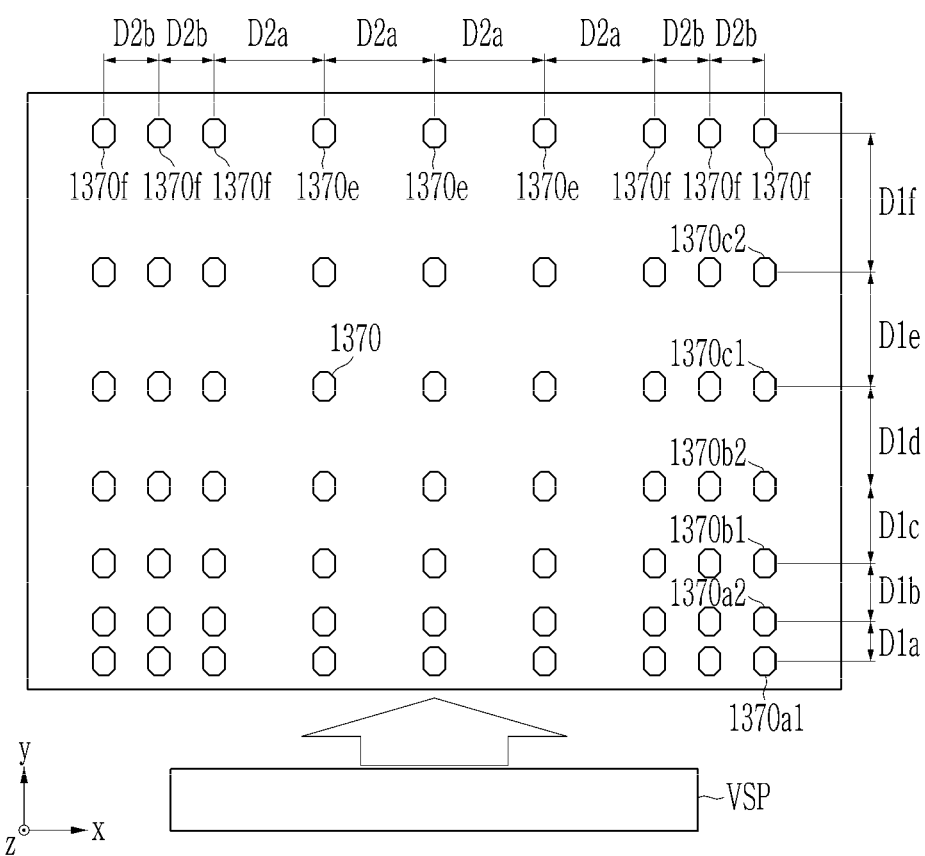
FIG. 13 is a top plan view of alignment of openings for common electrode connection of the display device according to one or more other embodiments.

Hereinafter, the openings for connection 1370 of the emission layer 370 of the display device according to one or more embodiments will be described in more detail with reference to FIG. 13, together with FIG. 1 to FIG. 8. FIG. 13 is a top plan view of alignment of openings for common electrode connection of the display device according to one or more other embodiments.

Referring to FIG. 13, as in one or more embodiments described with reference to FIG. 12, a distance between two openings for connection 1370 adjacent to each other along the second direction y (among the plurality of openings for connection 1370 for connecting the common electrode 270 and the connection electrode 195) may not be constant and may depend on respective positions thereof. Further, unlike the one or more embodiments described with reference to FIG. 12, a distance between two openings for connection 1370 that are adjacent to each other along the first direction x may not be constant depending on positions.

Referring to FIG. 13, similar to one or more embodiments shown in FIG. 12, a plurality of openings for connection 1370 may include a first opening for connection 1370a1, a second opening for connection 1370a2, a third opening for connection 1370b1, a fourth opening for connection 1370b2, a fifth opening for connection 1370c1, a sixth opening 1370c2 for connection, and a seventh opening for connection 1370d1, which are sequentially located from a location closest to a driving voltage applying portion VSP to a direction away from the driving voltage applying portion VSP along a second direction y in which a common voltage line 170 extends. In the illustrated example, seven openings for connection 1370 are included along the second direction y, but this is not restrictive, and a plurality of openings for connection 1370 may be located along the second direction y.

Among the plurality of openings for connection 1370, a first distance D1a between the first opening for connection 1370a1 and the second opening for connection 1370a2 may be less than a second distance D1b between the second opening for connection 1370a2 and the third opening for connection 1370b1, a third distance D1c between the third opening for connection 1370b1 and the fourth opening for connection 1370b2 may be greater than the second distance D1b, a fourth distance D1d between the fourth opening for connection 1370b2 and the fifth opening for connection 1370c1 may be greater than the third distance D1c, a fifth distance D1e between the fifth opening for connection 1370c1 and the sixth opening for connection 1370c2 may be greater than the fourth distance D1d, and a sixth distance D1f between the sixth opening for connection 1370c2 and the seventh opening for connection 1370d1 may be greater than the fifth distance D1e.

As described, a distance between two openings for connection 1370 that are adjacent to each other along the second direction y may be different depending on the respective positions of the openings for connection 1370. For example, as the positions of the plurality of openings for connection 1370 are closer to the driving voltage applying portion VSP, the distance between the two adjacent openings for connection 1370 may decrease, and as the positions of the plurality of openings for connection 1370 are farther from the driving voltage applying portion VSP, the distance between two adjacent openings for connection 1370 may increase. Also, as the positions of the plurality of openings for connection 1370 move away from the driving voltage applying portion VSP, the distance between the two adjacent openings for connection 1370 may sequentially increase.

In addition, the display device according to one or more embodiments shown in FIG. 13 may include a plurality of eighth openings for connection 1370e generally located at a center portion of the display device along the first direction x, and a plurality of ninth openings for connection 1370f located at, or close to, an edge portion of the display device along the first direction x, and an eighth distance D2b between two adjacent ninth openings for connection 1370f may be less than a seventh distance D2a between two adjacent eighth openings for connection 1370e.

The common voltage lines 170 may be located at regular intervals to the center portion of the display device, although the common voltage lines 170 might not be located to the edge portion of the display device.

Accordingly, the voltage drop of the common electrode 270 located at the edge of the display device may be greater than the common electrode 270 located at the central portion of the display device.

However, in the display device according to the present example, the distance between the ninth openings for connection 1370f located at the edge of the display device is formed to be smaller than the distance between the eighth openings for connection 1370e located at the center of the display device, and thus a voltage drop of the common voltage VSS that may occur at edges of the display device can be reduced.

As described, in the display device according to the present example, the voltage drop difference of the common voltage VSS applied to the common electrode 270 is reduced or prevented not only in the second direction y where the common voltage line 170 extends, but also in the first direction x, such that magnitude deviation of the common voltage VSS according to the position on the display device can be reduced, thereby reducing or preventing display quality deterioration due to the magnitude deviation of the common voltage VSS.

Figure 14:
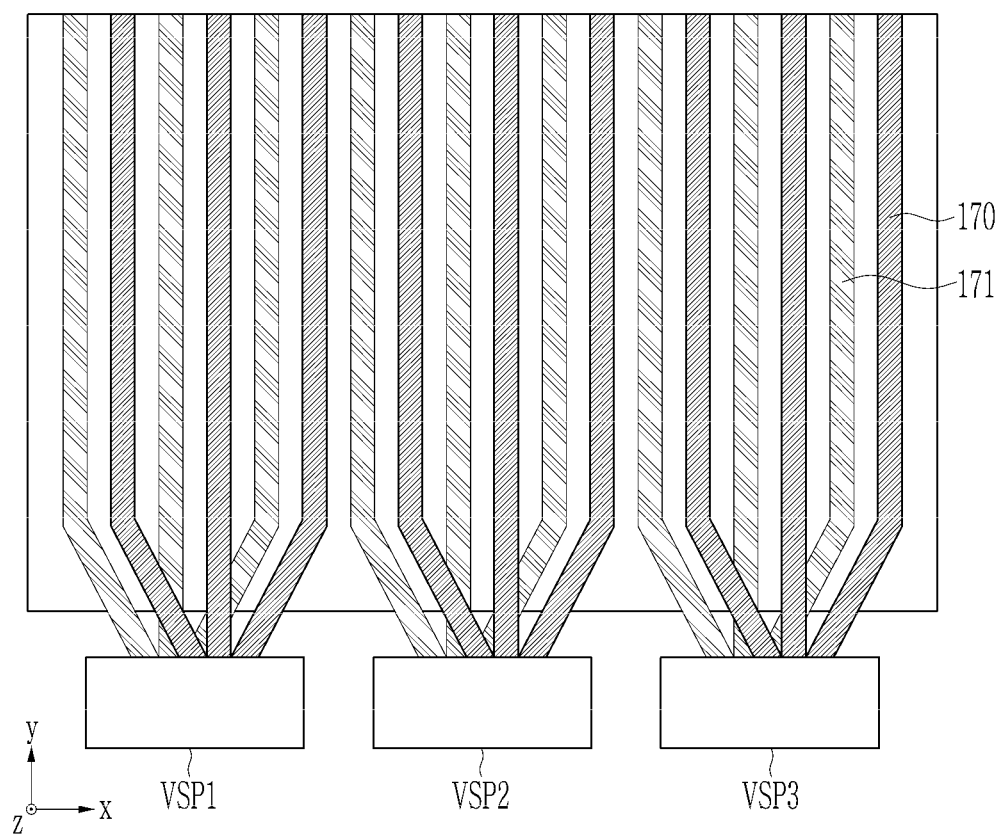
FIG. 14 is a top plan view of some signal lines of a display device according to one or more other embodiments.
Figure 15:
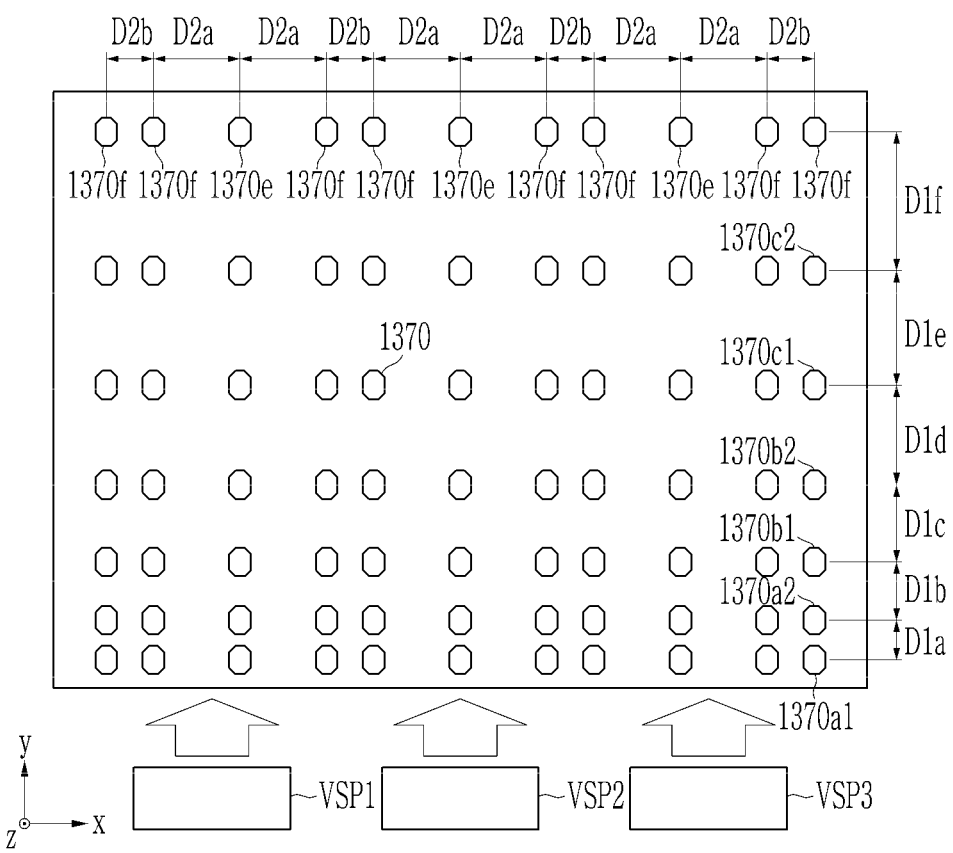
FIG. 15 is a top plan view of an alignment of openings for common electrode connection of the display device according to one or more other embodiments.

Next, referring to FIG. 14 and FIG. 15, a display device according to one or more other embodiments will be described. FIG. 14 is a top plan view of some signal lines of a display device according to one or more other embodiments, and FIG. 15 is a top plan view of an alignment of openings for common electrode connection of the display device according to one or more other embodiments.

Referring to FIG. 14, a display device according to the present example may include a plurality of driving voltage applying portions VSP1, VSP2, and VSP3 that are arranged along a first direction x. The display device according to one or more embodiments includes three driving voltage applying portions VSP1, VSP2, and VSP3, but this is not restrictive, and may also include all cases including a plurality of driving voltage applying portions.

The display device according to the present example includes a plurality of common voltage lines 170 and a plurality of driving voltage lines 171. The plurality of common voltage lines 170 and the plurality of driving voltage lines 171 may extend in a second direction y, and may be divided into a plurality of groups, and thus may be respectively applied with a common voltage VSS and a driving voltage VDD from a plurality of driving voltage applying portions (e.g., VSP1, VSP2, and VSP3) located on one side of a display panel 100 of the display device in the second direction y.

Thus, the common voltage VSS applied to the plurality of driving voltage applying portions VSP1, VSP2, and VSP3 is transmitted toward a side that is opposite the side of the display panel 100 at which the driving voltage applying portions VSP1, VSP2, and VSP3 are located.

Referring to FIG. 15, similar to one or more embodiments shown in FIG. 12 and FIG. 13, the plurality of openings for connection 1370 may include a first opening for connection 1370a1, a second opening for connection 1370a2, a third opening for connection 1370b1, a fourth opening for connection 1370b2, a fifth opening for connection 1370c1, a sixth opening for connection 1370c2, and a seventh opening for connection 1370d1 that are sequentially located from a location closest to a driving voltage applying portion VSP (e.g., VSP1, VSP2, and VSP3) to a direction away from the driving voltage applying portion VSP along a second direction y in which a common voltage line 170 extends. In the illustrated example, seven openings for connection 1370 are included along the second direction y, but this is not restrictive, and a differently numbered plurality of openings for connection 1370 may be located along the second direction y.

Among the plurality of openings for connection 1370, a first distance D1a between the first opening for connection 1370a1 and the second opening for connection 1370a2 may be greater than a second distance D1b between the second opening for connection 1370a2 and the third opening for connection 1370b1, a third distance D1c between the third opening for connection 1370b1 and the fourth opening for connection 1370b2 may be greater than the second distance D1b, a fourth distance D1d between the fourth opening for connection 1370b2 and the fifth opening for connection 1370c1 may be greater than the third distance D1c, a fifth distance D1e between the fifth opening for connection 1370c1 and the sixth opening for connection 1370c2 may be greater than the fourth distance D1d, and a sixth distance D1f between the sixth opening for connection 1370c2 and the seventh opening for connection 1370d1 may be greater than the fifth distance D1e.

As described, a distance between two openings for connection 1370 that are adjacent to each other along the second direction y may depend on the position of the opening for connection 1370. For example, as the position of the plurality of openings for connection 1370 approaches the driving voltage applying portion VSP, the distance between the two adjacent openings for connection 1370 may decrease, and as the position of the plurality of openings for connection 1370 becomes farther from the driving voltage applying portion VSP, the distance between two adjacent openings for connection 1370 may increase. That is, as the positions of the plurality of openings for connection 1370 move away from the driving voltage applying portion VSP, the distance between the two adjacent openings for connection 1370 may sequentially increase.

In addition, in a display device according to one or more embodiments shown in FIG. 15, there may be a plurality of eighth openings for connection 1370e that overlap a common voltage line 170 generally located at a center portion of a respective driving voltage applying portion VSP1, VSP2, or VSP3 along a first direction x (among a plurality of common voltage lines 170 that are respectively connected to the plurality of driving voltage applying portions VSP1, VSP2, and VSP3), and a plurality of ninth openings for connection 1370f that overlap a common voltage line 170 located at or near an edge of the respective driving voltage applying portion VSP1, VSP2, and VSP3 along the first direction x (among the plurality of common voltage lines 170 that are respectively connected to the plurality of driving voltage applying portions VSP1, VSP2, and VSP3). Further, a seventh distance D2a between two adjacent eighth openings for connection 1370e, or between an eighth opening for connection 1370e and one or more adjacent ninth openings for connection 1370f, may be smaller than an eighth distance D2b between two adjacent ninth openings for connection 1370f.

As described, in the display device according to the present example, the voltage drop difference of the common voltage VSS applied to the common electrode 270 is reduced not only in the second direction y where the common voltage line 170 extends, but also in the first direction x according to the position of the display device, such that magnitude deviation of the common voltage VSS according to the position of the display device can be reduced, thereby reducing or preventing display quality deterioration due to the magnitude deviation of the common voltage VSS.

Figure 16:
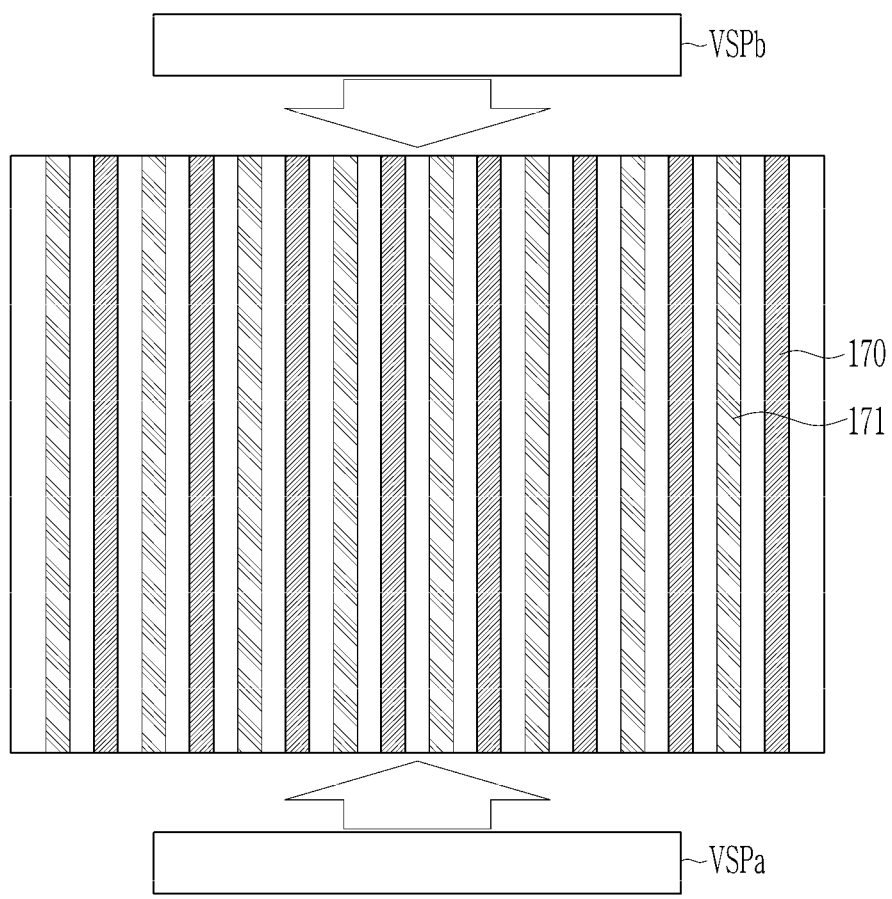
FIG. 16 is a top plan view of some signal lines of a display device according to one or more other embodiments.
Figure 17:
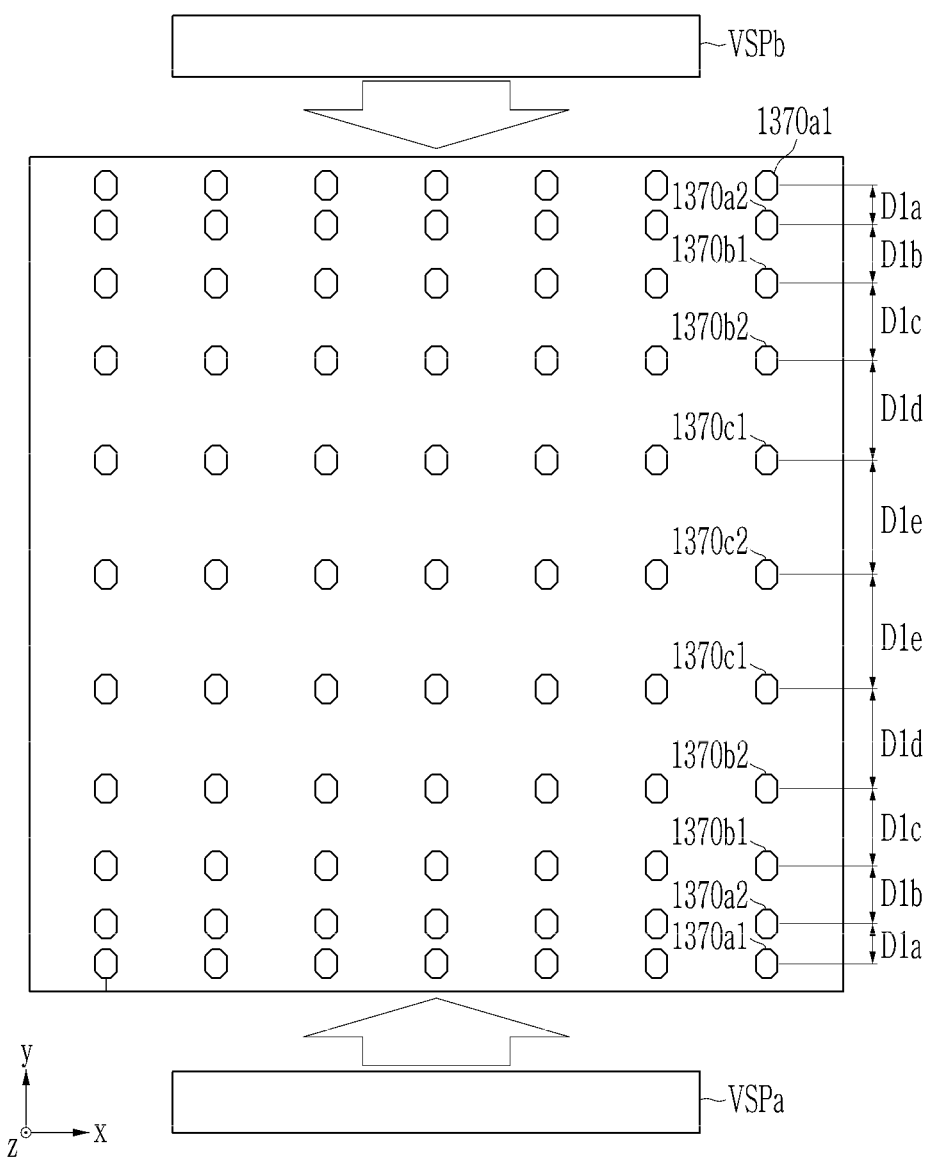
FIG. 17 is a top plan view of alignment of openings for common electrode connection of the display device according to one or more other embodiments.

Next, referring to FIG. 16 and FIG. 17, a display device according to one or more other embodiments will be described. FIG. 16 is a top plan view of some signal lines of a display device according to one or more other embodiments, and FIG. 17 is a top plan view of alignment of openings for common electrode connection of the display device according to one or more other embodiments.

Referring to FIG. 16, a display device according to the present example may include a plurality of common voltage lines 170 and a plurality of driving voltage lines 171 extending in a second direction y, and may include two driving voltage applying portions VSPa and VSPb that face each other along the second direction y.

The plurality of common voltage lines 170 and the plurality of driving voltage lines 171 are connected to the two driving voltage applying portions VSPa and VSPb to apply a common voltage VSS and a driving voltage VDD from the two driving voltage applying portions VSPa and VSPb.

Accordingly, the common voltage VSS applied from the two driving voltage applying portions VSPa and VSPb is transmitted toward a center portion of the display device from two opposite edges facing each other along the second direction y, and at which the two driving voltage applying portions VSPa and VSPb are located, as shown by the arrows in FIG. 16.

The common electrode 270 may receive the common voltage VSS through the plurality of common voltage lines 170, and a distance between two openings adjacent to each other along the second direction y among the plurality of openings for connection 1370 for connecting a common electrode 270 and a connection electrode 195 may not be constant depending on the position.

Referring to FIG. 17, a plurality of openings for connection 1370 may include first openings for connection 1370a1 located closest to one of the two driving voltage applying portions VSPa and VSPb, respectively, second openings for connection 1370a2 located adjacent to respective ones of the first openings for connection 1370a1 along the second direction y in which the common voltage line 170 extends, third openings for connection 1370b1 located adjacent to respective ones of the second openings for connection 1370a2 along the second direction y, fourth openings for connection 1370b2 located adjacent to respective ones of the third opening for connection 1370b1 along the second direction y, fifth openings for connection 1370c1 located adjacent to respective ones of the fourth opening for connection 1370b2 along the second direction y, and a sixth opening for connection 1370c2 located adjacent to the fifth openings for connection 1370c1 along the second direction y.

Among the plurality of openings for connection 1370, a first distance D1a between a first opening for connection 1370a1 and a second opening for connection 1370a2 may be greater than a second distance D1b between the second opening for connection 1370a2 and a third opening for connection 1370b1, a third distance D1c between the third opening for connection 1370b1 and a fourth opening for connection 1370b2 may be greater than the second distance D1b, a fourth distance D1d between the fourth opening for connection 1370b2 and a fifth opening for connection 1370c1 may be greater than the third distance D1c, and a fifth distance D1e between the fifth opening for connection 1370c1 and the sixth opening for connection 1370c2 may be greater than the fourth distance D1d.

As described, a distance between two openings for connection 1370 that are adjacent to each other along the second direction y may be different depending on the position of the opening for connection 1370. For example, as the position of the plurality of openings for connection 1370 is closer to one of the two driving voltage applying portions VSPa and VSPb, the distance between the two adjacent openings for connection 1370 may become narrowed, and as the position of the plurality of openings for connection 1370 is farther from the two driving voltage applying portions VSPa and VSPb (e.g., toward a center portion of the display device), the distance between two adjacent openings for connection 1370 may become widened. Further, as the positions of the plurality of openings for connection 1370 move away from a closest one of the two driving voltage applying portions VSPa and VSPb, the distance between the two adjacent openings for connection 1370 may sequentially increase.

As previously described, the common voltage VSS applied from two driving voltage applying portions VSPa and VSPb are sequentially transmitted toward a center portion of the display device from two edges that face each other along the second direction y at which the two driving voltage applying portions VSPa and VSPb are located as marked by the arrow shown in FIG. 16.

Therefore, the closer the position of pixels PX to either of the two driving voltage applying portions VSPa and VSPb, the greater the number of connection portions between the common electrode 270 and the common voltage line 170. Accordingly, as the position of the pixel PX is closer to the two driving voltage applying portions VSPa and VSPb, the degree of the voltage drop of the common voltage VSS may be further reduced.

As such, in the display device according to the present example, it is possible to reduce the voltage drop difference of the common voltage VSS applied to the common electrode 270 according to the position of the display device, and thus there may be little or no deviation in the magnitude of the common voltage VSS according to the position of the display device. Therefore, it is possible to reduce or prevent display quality deterioration due to magnitude deviation of the common voltage VSS.

Figure 18:
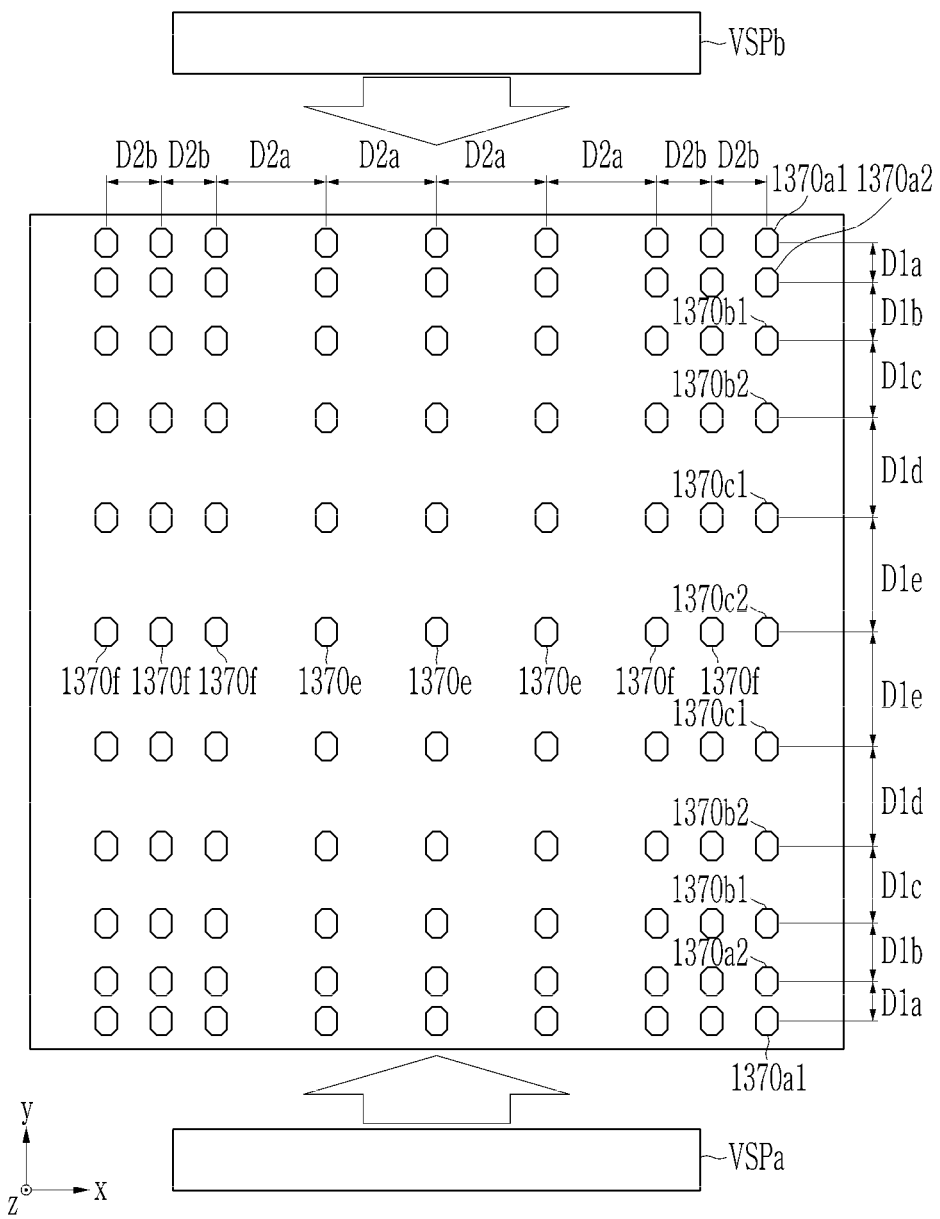
FIG. 18 is a top plan view of alignment of openings for common electrode connection of the display device according to one or more other embodiments.

Next, a display device according to one or more other embodiments will be described with reference to FIG. 18, together with FIG. 16. FIG. 18 is a top plan view of alignment of openings for common electrode connection of the display device according to one or more other embodiments.

Referring to FIG. 18, similar to one or more embodiments described with reference to FIG. 17, a distance between two openings for connection 1370 adjacent to each other along the second direction y (among the plurality of openings for connection 1370 for connecting the common electrode 270 and the connection electrode 195) may not be constant depending on positions. Unlike the one or more embodiments described with reference to FIG. 17, a distance between two openings for connection 1370 that are adjacent to each other along the first direction x may not be constant depending on positions as well.

Similar to one or more embodiments described with reference to FIG. 17, the display device according to the present example may include first openings for connection 1370a1 located closest to a respective one of the two driving voltage applying portions VSPa and VSPb, a second opening for connection 1370a2 located adjacent to a respective one of the first openings for connection 1370a1 along the second direction y in which the common voltage line 170 extends, a third opening for connection 1370b1 located adjacent to a respective one of the second openings for connection 1370a2 along the second direction y, a fourth opening for connection 1370b2 located adjacent to a respective one of the third openings for connection 1370b1 along the second direction y, a fifth opening for connection 1370c1 located adjacent to a respective one of the fourth openings for connection 1370b2 along the second direction y, and a sixth opening for connection 1370c2 located adjacent to the fifth openings for connection 1370c1 along the second direction y.

Among the plurality of openings for connection 1370, a first distance D1a between a respective one of the first opening for connections 1370a1 and a respective one of the second opening for connections 1370a2 may be greater than a second distance D1b between the second opening for connection 1370a2 and a respective one of the third opening for connections 1370b1, a third distance D1c between the third opening for connection 1370b1 and a respective one of the fourth openings for connection 1370b2 may be greater than the second distance D1b, a fourth distance D1d between the fourth opening for connection 1370b2 and a respective one of the fifth openings for connection 1370c1 may be greater than the third distance D1c, and a fifth distance Die between the fifth opening for connection 1370c1 and the sixth opening for connection 1370c2 may be greater than the fourth distance D1d.

As described, a distance between two openings for connection 1370 that are adjacent to each other along the second direction y may be different depending on the position of the opening 1370 for connection 1370. For example, as the position of the plurality of openings for connection 1370 is closer to the two driving voltage applying portions VSPa and VSPb, the distance between the two adjacent openings for connection 1370 may become narrowed, and as the position of the plurality of openings for connection 1370 is farther from the two driving voltage applying portions VSPa and VSPb, the distance between two adjacent openings for connection 1370 may become widened. That is, as the positions of the plurality of openings for connection 1370 move away from the two driving voltage applying portions VSPa and VSPb (e.g., toward a center portion of the display device), the distance between the two adjacent openings for connection 1370 may sequentially increase.

In addition, the display device according to one or more embodiments shown in FIG. 18 may include a plurality of eighth openings for connection 1370e located at a center portion of the display device along the first direction x, and a plurality of ninth openings for connection 1370f located at or near edge portions of the display device along the first direction x. An eighth distance D2b between two adjacent ninth openings for connection 1370f may be less than a seventh distance D2a between two adjacent eighth openings for connection 1370e or between adjacent respective eighth and ninth openings for connection 1370e and 1370f.

The common voltage line 170 may be generally located toward the center portion of the display device at regular intervals, but the common voltage line 170 might not be located to the edge portion of the display device.

Accordingly, the voltage drop of the common electrode 270 located at the edge of the display device may be greater than that at or near the central portion of the display device.

However, in the display device according to the present example, the distance between the ninth openings for connection 1370f located at the edge of the display device is smaller than the distance between the eighth openings for connection 1370e located at the center of the display device, and thus a voltage drop of the common voltage VSS that may occur at both edges of the display device can be reduced.

As described, in the display device according to the present example, the voltage drop difference of the common voltage VSS applied to the common electrode 270 is reduced not only in the second direction y where the common voltage line 170 extends, but is also reduced in the first direction x according to the position of the display device such that magnitude deviation of the common voltage VSS according to the position of the display device can be reduced, thereby reducing or preventing display quality deterioration due to the magnitude deviation of the common voltage VSS.

While this disclosure has been described in connection with what is presently considered to be practical embodiments, it is to be understood that the invention is not limited to the disclosed embodiments. On the contrary, it is intended to cover various modifications and equivalent arrangements included within the spirit and scope of the appended claims, with functional equivalents thereof to be included therein.

DESCRIPTION OF SYMBOLS

110: substrate
111: buffer layer
1132: channel region
1131, 1133: conductive region
1182, 1184, 1350, 351: opening
1370, 1370a1, 1370a2, 1370b1, 1370b2, 1370c1, 1370c2, 1370d1, 1370e, 1370f: opening for connection
170: common voltage line
177: light blocking pattern,
120, 160, 180: insulation layer
180a, 180b: protective layer
191: pixel electrode
270: common electrode
370: emission layer
PX: pixel
PX1, PX2, PX3: sub-pixel
VSP, VSP1, VSP2, VSP3, VSPa, VSPb: driving voltage applying portion

What is claimed is:

1. A display device comprising:
   a substrate;
   common voltage lines on the substrate, and extending in a second direction;
   connection electrodes on the common voltage lines;
   an emission layer on the connection electrodes;
   a common electrode on the emission layer; and
   a voltage applying portion configured to apply a common voltage to the common electrode,
   wherein the emission layer defines openings for connection through which the common electrode is electrically connected with respective ones of the connection electrodes, and
   wherein distances between respective adjacent ones of the openings for connection increase as a distance from the voltage applying portion increases along the second direction.

2. The display device of claim 1, wherein the openings for connection comprise:
   a first opening for connection that is closest to the voltage applying portion;
   a second opening for connection closest to the first opening for connection along the second direction among the openings for connection;
   a sixth opening for connection that is furthest from the voltage applying portion with respect to the second direction; and
   a fifth opening for connection closest to the sixth opening for connection along the second direction among the openings for connection, and
   wherein a first distance between the first opening for connection and the second opening for connection is less than a fifth distance between the fifth opening for connection and the sixth opening for connection.

3. The display device of claim 2, wherein the openings for connection further comprise a fourth opening for connection, and a third opening for connection closest to the fourth opening for connection along the second direction among the openings for connection,
   wherein the third opening for connection and the fourth opening for connection are between the second opening for connection and the fifth opening for connection, and
   wherein a third distance between the third opening for connection and the fourth opening for connection is greater than the first distance, and less than the fifth distance.

4. The display device of claim 3, wherein the openings for connection further comprise:
   two adjacent eighth openings for connection located near a center of the substrate along a first direction that is perpendicular to the second direction, and separated by a seventh distance along the first direction; and
   two adjacent ninth openings for connection located near an edge of the substrate along the first direction and separated by an eighth distance along the first direction,
   wherein the seventh distance is greater than the eighth distance.

5. The display device of claim 4, wherein the voltage applying portion is at one side of the substrate along the second direction.

6. The display device of claim 4, wherein the voltage applying portion comprises a pair of voltage applying portions at respective opposite sides of the substrate along the second direction.

7. The display device of claim 3, wherein the voltage applying portion is at one side of the substrate along the second direction.

8. The display device of claim 3, wherein the voltage applying portion comprises a pair of voltage applying portions at respective opposite sides of the substrate along the second direction.

9. The display device of claim 3, wherein the voltage applying portion comprises a plurality of voltage applying portions on one side of the substrate along the second direction, and spaced apart from each other along a first direction that is perpendicular to the second direction.

10. The display device of claim 9, wherein the openings for connection further comprise:
eighth openings for connection overlapping respective ones of the common voltage lines respectively connected to center portions of the voltage applying portions; and
ninth openings for connection overlapping others of the common voltage lines respectively connected to edge portions of the voltage applying portions,
wherein a distance between one of the eighth openings and one of the ninth openings that are adjacent to each other along the first direction is greater than a distance between two of the ninth openings that are adjacent to each other along the first direction.

11. The display device of claim 1, further comprising sub-pixels representing different respective colors and comprising a transistor, and a light emitting diode that comprises a pixel electrode, the emission layer, and the common electrode.

12. The display device of claim 11, wherein the connection electrodes are in a same conductive layer as, and comprise a same material as, the pixel electrode.

13. The display device of claim 12, further comprising an insulation layer between the pixel electrode and the emission layer, and defining an additional opening overlapping a first opening for connection of the openings for connection.

14. The display device of claim 13, wherein the first opening for connection is within an edge of the additional opening in a plan view.

15. The display device of claim 13, wherein an edge of the first opening for connection and an edge of the additional opening are aligned with each other.

16. A display device comprising:
a substrate;
common voltage lines on the substrate, and extending in a second direction;
connection electrodes on the common voltage lines;
an emission layer on the connection electrode;
a common electrode on the emission layer; and
a voltage applying portion configured to apply a common voltage to the common electrode,
wherein the emission layer defines openings for connection through which the common electrode is electrically connected with the connection electrode, and
wherein distances between respective adjacent ones of the openings for connection along a first direction that is perpendicular to the second direction is greater near a center portion of the substrate, and smaller near an edge of the substrate.

17. The display device of claim 16, wherein a distance between two of the openings for connection closest to each other along the first direction and located at the center portion of the substrate is greater than a distance between two of the openings for connection closest to each other along the first direction and located at edges of the substrate along the first direction.

18. The display device of claim 17, wherein the voltage applying portion is at one side of the substrate along the second direction.

19. The display device of claim 17, wherein the voltage applying portion comprises a pair of voltage applying portions at respective opposite sides of the substrate along the second direction.

20. The display device of claim 17, wherein the voltage applying portion comprises a plurality of voltage applying portions at one side of the substrate along the second direction, and spaced apart from each other along the first direction.

* * * * *